(12) United States Patent
Wang et al.

(10) Patent No.: US 11,195,761 B2
(45) Date of Patent: Dec. 7, 2021

(54) IC STRUCTURE WITH SHORT CHANNEL GATE STRUCTURE HAVING SHORTER GATE HEIGHT THAN LONG CHANNEL GATE STRUCTURE

(71) Applicant: GLOBALFOUNDRIES U.S. INC., Santa Clara, CA (US)

(72) Inventors: Haiting Wang, Clifton Park, NY (US); Hong Yu, Clifton Park, NY (US); Steven J. Bentley, Menands, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 1 day.

(21) Appl. No.: 16/804,920

(22) Filed: Feb. 28, 2020

(65) Prior Publication Data
US 2021/0272851 A1 Sep. 2, 2021

(51) Int. Cl.
*H01L 27/092* (2006.01)
*H01L 21/8234* (2006.01)
*H01L 27/088* (2006.01)
*H01L 29/423* (2006.01)
*H01L 23/535* (2006.01)

(52) U.S. Cl.
CPC ........ *H01L 21/823456* (2013.01); *H01L 21/823475* (2013.01); *H01L 23/535* (2013.01); *H01L 27/088* (2013.01); *H01L 29/42376* (2013.01)

(58) Field of Classification Search
CPC . H01L 27/088; H01L 27/092; H01L 27/0922; H01L 29/42312; H01L 29/42316; H01L 29/42376; H01L 29/66484; H01L 29/7831; H01L 29/7832
See application file for complete search history.

(56) References Cited

U.S. PATENT DOCUMENTS

| | | | |
|---|---|---|---|
| 7,977,181 B2 | 7/2011 | Lai et al. | |
| 8,598,028 B2 | 12/2013 | Tu et al. | |
| 2006/0211200 A1* | 9/2006 | Tomita | H01L 21/823462 438/257 |
| 2015/0008488 A1 | 1/2015 | Hall et al. | |

* cited by examiner

*Primary Examiner* — Hoai V Pham
(74) *Attorney, Agent, or Firm* — Hoffman Warnick LLC

(57) ABSTRACT

An integrated circuit (IC) structure includes a long channel (LC) gate structure over a long channel region, the LC gate structure having a first gate height; and a short channel (SC) gate structure over a short channel region, the SC gate structure having a second gate height. The short channel region is shorter in length than the long channel region. The second gate height of the SC gate structure is no larger than the first gate height of the LC gate structure.

18 Claims, 9 Drawing Sheets

IC STRUCTURE WITH SHORT CHANNEL GATE STRUCTURE HAVING SHORTER GATE HEIGHT THAN LONG CHANNEL GATE STRUCTURE

BACKGROUND

The present disclosure relates to integrated circuit (IC) fabrication, and more specifically, to an integrated circuit (IC) structure including a short channel gate structure having a shorter gate height than the gate height of a long channel gate structure, and a related method of forming the same.

Advanced manufacturing of ICs requires formation of individual circuit elements, e.g., transistors such as field-effect transistors (FETs) and the like, based on specific circuit designs. A FET generally includes source, drain, and gate regions. A channel region is a space in semiconductor material between the source and drain regions. The gate region controls the current through the channel region between the source and drain regions. Gates may be composed of various metals and often include a work function metal which is chosen to create desired characteristics of the FET. Transistors may be formed over a substrate and may be electrically isolated with an insulating dielectric layer, e.g., inter-level dielectric (ILD) layer. Contacts may be formed to each of the source, drain, and gate regions through the dielectric layer in order to provide electrical connection between the transistors and other circuit elements that may be formed subsequent to the transistor in other metal levels.

Certain IC structures include transistors having gates with both, comparatively, short gate lengths and long gate lengths. The gate length of a transistor generally refers to the length of the separation between the source and drain regions. The length between the source and drain regions is referred to as a "channel." Thus, a gate structure having a longer gate length is referred to as a long channel gate structure, and a gate structure having the shorter gate length is referred to a short channel gate structure.

One challenge with use of long and short channel gate structures is controlling the gate height, which impacts the effective capacitance of the devices and their overall performance. Shorter gate height typically improves performance. Current processing employs a planarization process after formation of gate material over the channel regions that removes more gate material over the long channel gate structure than the short channel gate structure. More particularly, because the long channel gate structures have greater area exposed to the planarization process, they tend to have gate material removed faster than the smaller, more densely patterned short channel gate structures. Consequently, the gates for the long channel gate structures end up shorter than those for the short channel gate structures, which limits the minimum gate height achievable for the short channel gate structures. In turn, this limits performance. Additional planarization to reduce the average gate height typically results in over-polishing in some regions and lowers yield.

SUMMARY

Aspects of the disclosure are directed to an integrated circuit (IC) structure, comprising: a first gate structure over a first channel region in a substrate, the first gate structure having a first gate height; and a second gate structure over a second channel, the second gate structure having a second gate height, wherein the second channel region is shorter in length than the first channel region, and wherein the second gate height of the second gate structure is no larger than the first gate height of the first gate structure.

Further aspects of the disclosure include an integrated circuit (IC) structure, comprising: a long channel (LC) gate structure over a first channel region in a substrate, the LC gate structure having a first gate height; and a short channel (SC) gate structure over a second channel region, the SC gate structure having a second gate height, wherein the second channel region is shorter in length than the first channel region, wherein the second gate height of the SC gate structure is no larger than the first gate height of the LC gate structure.

Yet another aspect of the disclosure relates to a method, comprising: forming a gate material for a first gate structure over a first channel region in a substrate and for a second gate structure over a second channel region, wherein the second channel region is shorter in length than the first channel region; planarizing the gate material, resulting in the first gate structure having a first gate height less than a second gate height of the second gate structure; forming a mask over the first gate structure, exposing the second gate structure; recessing the gate material to have the second gate height be no larger than the first gate height; removing the mask; and forming a contact to each of the first and second gate structures.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

Figure 1:
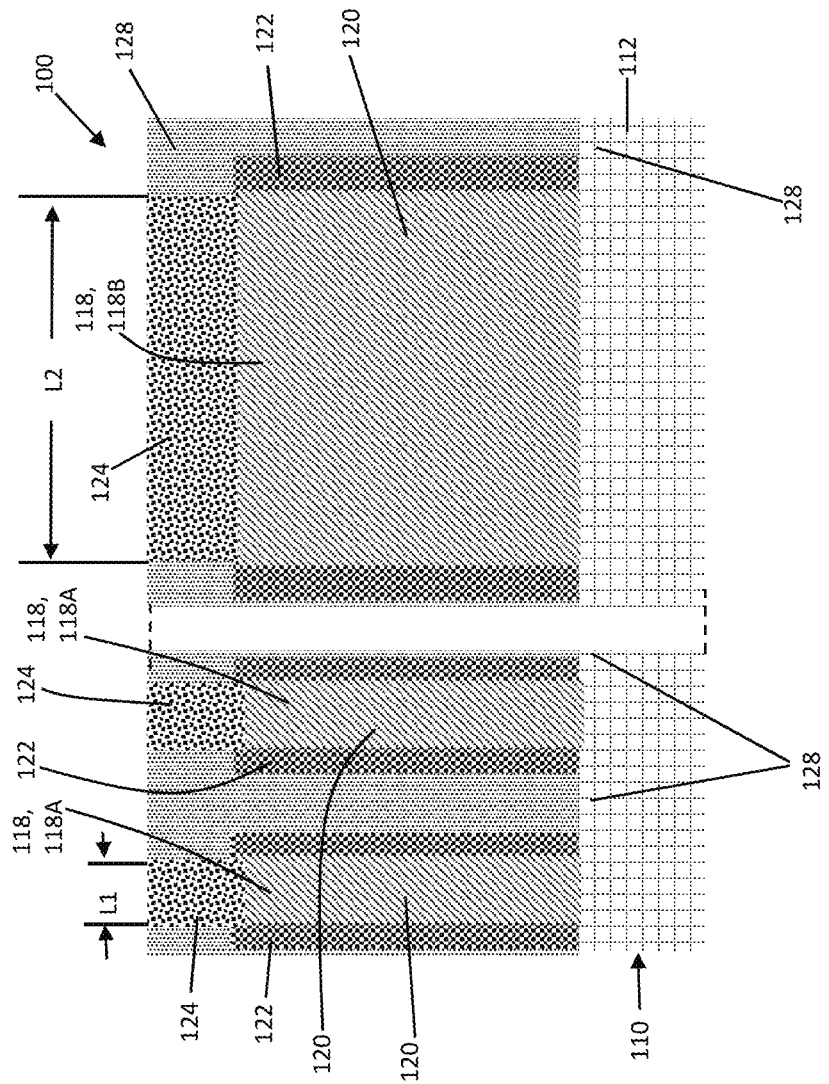
FIG. 1 shows a cross-sectional view of a preliminary structure upon which embodiments of a method according to the disclosure may be employed.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide an integrated circuit (IC) structure. The IC structure may include a first, long channel (LC) gate structure over a long channel region, the LC gate structure having a first gate height; and a second, short channel (SC) gate structure over a short channel region, the SC gate structure having a second gate height. The short channel region is shorter in length than the long channel region. Notably, in contrast to conventional IC structures that include long and short channel gate structures, the second gate height of the SC gate structure is no larger than, and may be shorter than, the second gate height of the LC gate structure. Embodiments of the disclosure also include a related method.

Referring to the drawings, a method of forming an IC structure 200 (FIG. 9) according to embodiments of the disclosure will now be described. FIG. 1 shows a cross-sectional view of a preliminary structure 100 upon which processes according to embodiments of the method will be employed. Preliminary structure 100 may be formed using any now known or later developed semiconductor processing techniques. Preliminary structure 100 may include a substrate 110 providing an active semiconductor region 112 in the form of, for example, a semiconductor fin. Substrate 110 and active semiconductor region 112 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity), or II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Both substrate 110 and active semiconductor region 112 may additionally comprise multilayer stacks composed of these semiconductors. Furthermore, a portion or entire semiconductor substrate 110 may be strained, or may comprise a semiconductor material with an inserted insulator layer, such as silicon-on-insulator (SOI). Where semiconductor fins are used for active semiconductor region 112, they may be formed using any now known or later developed additive or subtractive fin formation process.

Preliminary structure 100 may also include a plurality of dummy gates 118 over active semiconductor region 112. Each dummy gate 118 may include a body 120 and an adjacent gate spacer 122. Body 120 may include any now known or later developed dummy gate material such as but not limited to polysilicon or amorphous silicon. Gate spacer 122 may include any now known or later developed spacer material such as but not limited to silicon nitride or silicon oxide. A cap layer 124, formed from a material such as but not limited to silicon nitride, may be positioned over each dummy gate 118.

An interlayer dielectric (ILD) 126 may surround dummy gates 118. Suitable dielectric materials for ILD 126 may include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; tetraethyl orthosilicate, $Si(OC_2H_5)_4$ (TEOS) used to form silicon oxide ($SiO_2$); benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

Dummy gates 118 in preliminary structure 100 are configured for eventual creation of metal gate structures, as will be described herein, having different channel region lengths. To this end, dummy gates 118A are shorter in length than dummy gates 118B. In the example shown, dummy gates 118A have a length L1 that is less than a length L2 of dummy gates 118B. Lengths L1, L2 match the lengths of the channel regions formed in substrate 110.

As understood in the art, dummy gates 118 are used in a replacement metal gate (RMG) process. The RMG process may include any now known or later developed RMG techniques, and therefore will not be described in great detail herein. At this stage, source/drain regions 128 have been formed on active semiconductor region 112 adjacent dummy gates 118 and between spacers 122, e.g., by ion implantation and annealing. The RMG process may include, for example, replacing dummy gate(s) 118 over substrate 110 with a metal to form gate structures, as will be described herein.

Figure 2:
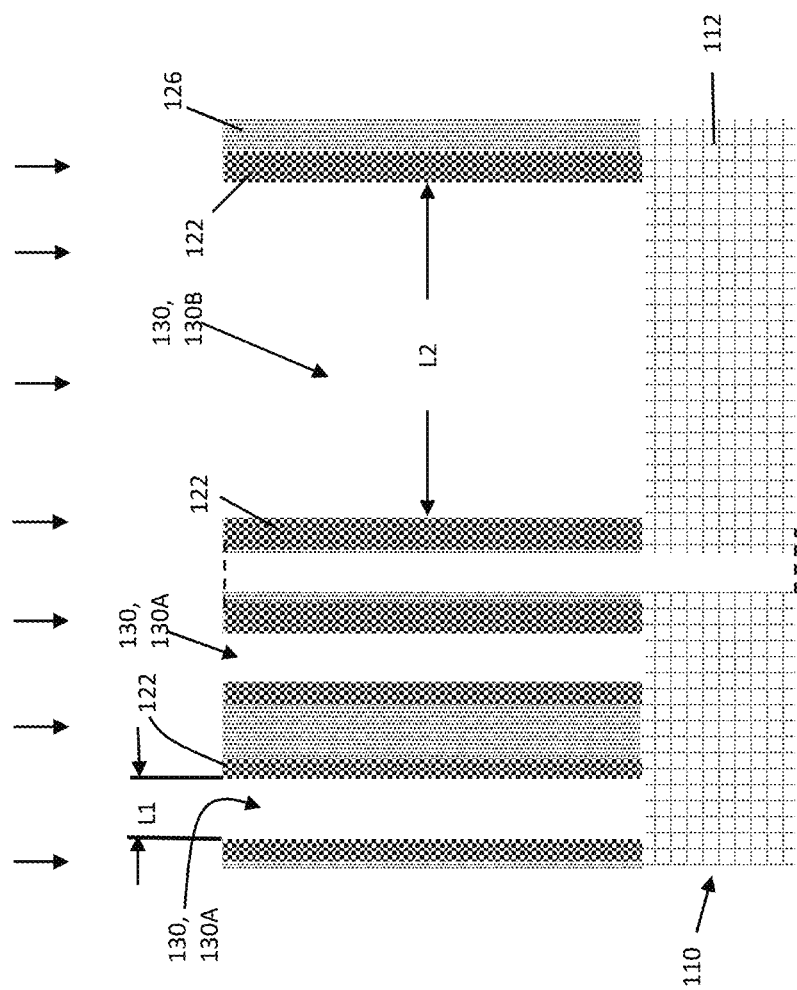
FIG. 2 shows a cross-sectional view of a dummy gate removal process according to embodiments of the disclosure.

As shown in the cross-sectional view of FIG. 2, the RMG process may include a step commonly called "dummy gate pull." In this process, dummy gate(s) 118 may be removed using any now known or later developed process. In one example, dummy gates 118 are etched away. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. In one example, dummy gates 118 may be removed, for example, by RIE. A mask not shown may be used to direct the etching.

It is understood that dummy gate 118 removal leaves trenches 130 in ILD 126, e.g., within spacers 122. Trenches 130 retain the dimensional differences from dummy gates 118. For example, trenches 130A have a length L1 that is shorter than a length L2 of trench 130B. Gate cut isolations (not shown) may also be provided to cut the eventually formed gate structures.

Figure 3:
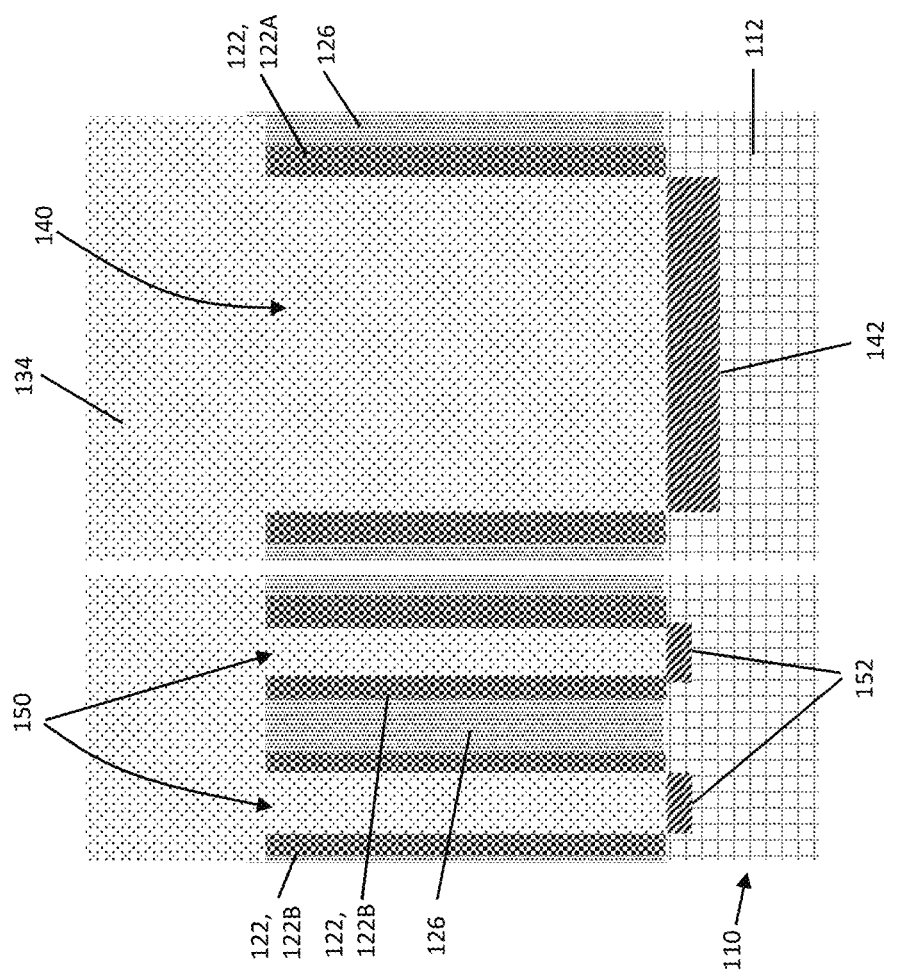
FIG. 3 shows a cross-sectional view of forming a gate material according to embodiments of the disclosure.

FIG. 3 shows a cross-sectional view of forming a gate material 134 for a first, long channel (LC) gate structure 140 (hereinafter "LC gate structure 140") over a first, long channel region 142 in substrate 110, and for a second, short channel (SC) gate structure 150 (hereinafter "SC gate structure 150") over a second, short channel region 152 in substrate 110. Note, channel regions 142, 152 are not shown in all figures for clarity. As used herein, the terms "long" and "short" relative to the gate structures and/or channel regions thereof are used comparatively. As understood in the field, the actual sizes of the gate structures may vary on the size of the device in which employed. While one LC gate structure 140 and two SC gate structures 150 are shown, any number may be employed. As noted, SC gate structure 150 is shorter in length than LC gate structure 140. Bottom surfaces 154 (FIG. 4) of LC gate structure 140 and SC gate structure 150 are substantially co-planar. That is, bottom surface 154 of both gate structures 140, 150 are on top of substrate 110, e.g., active semiconductor region 112, and substantially co-planar. A gate dielectric (not shown for clarity) may be formed within trenches 130A, 130B over substrate 110, i.e., active semiconductor region 112, prior to formation of gate material 134. The gate dielectric may include any now known or later developed high-K material typically used for metal gates such as but not limited to: metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). Gate material 134 may include various metals depending on whether for an NFET or PFET device, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. In one embodiment, gate material 134 may include tungsten (W).

Gate material 134 may be formed, for example, by deposition. "Depositing" or "deposition" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Gate material 134 may, for example, be deposited using any appropriate technique for tungsten (W), e.g., ALD. As shown in FIG. 3, forming gate material 134 may include depositing gate material 134 in a first gate spacer 122A for LC gate structure 140 and a second gate spacer 122B for SC gate structure 150.

While embodiments of the disclosure have been described herein as employing an RMG process, it is emphasized that other processing may be employed to achieve the structure of FIG. 3, e.g., a gate first process.

Figure 4:
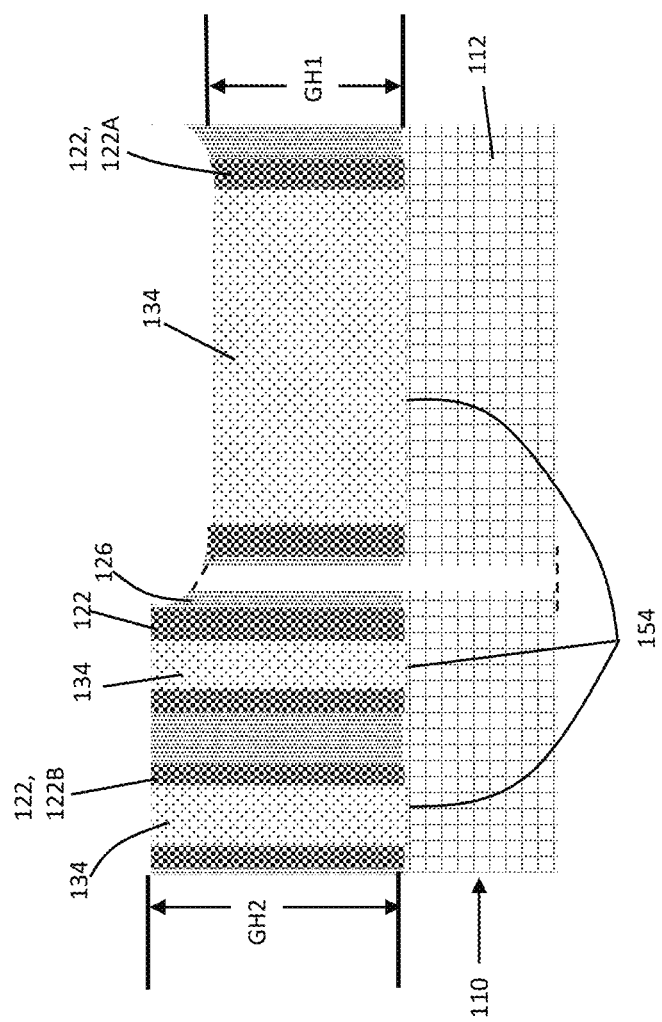
FIG. 4 shows a cross-sectional view of a planarizing process according to embodiments of the disclosure.
Figure 5:
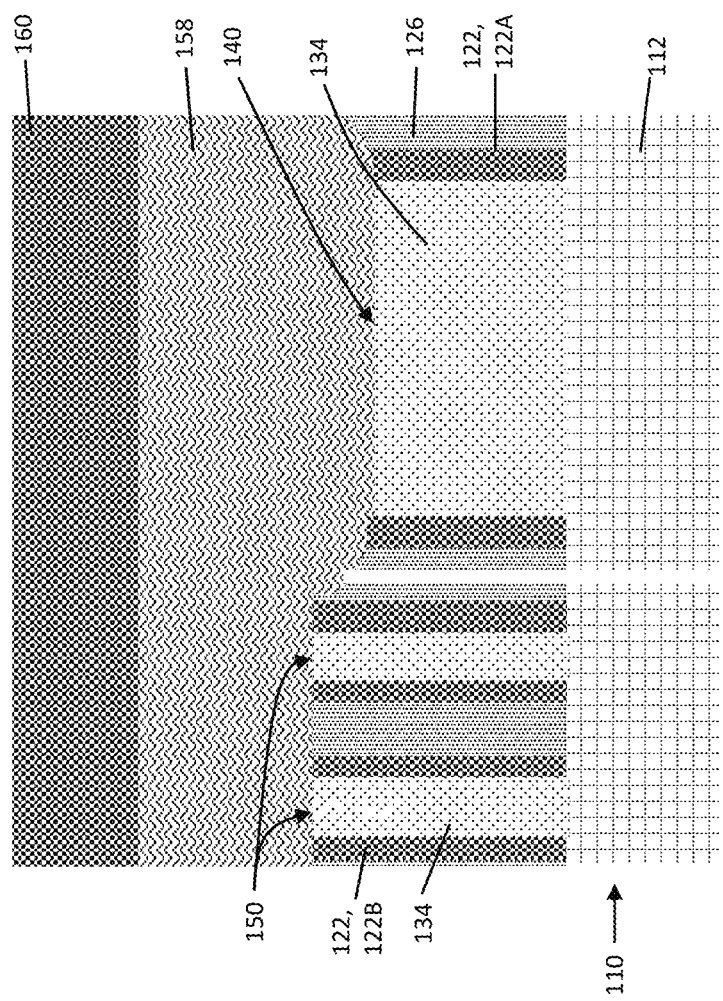
FIG. 5 shows a cross-sectional view of forming a mask over a long channel gate structure according to embodiments of the disclosure.

FIG. 4 shows a cross-sectional view of planarizing gate material 134. "Planarizing" or "planarization" refers to various processes that make a surface more planar (that is, more flat and/or smooth). Chemical-mechanical-polishing (CMP) is one currently conventional planarization process which planarizes surfaces with a combination of chemical reactions and mechanical forces. CMP uses slurry including abrasive and corrosive chemical components along with a polishing pad and retaining ring, typically of a greater diameter than the wafer. The pad and wafer are pressed together by a dynamic polishing head and held in place by a plastic retaining ring. The dynamic polishing head is rotated with different axes of rotation (that is, not concentric). This process removes material and tends to even out any "topography," making the wafer flat and planar. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back. In one example, as shown in the cross-section of FIG. 4, the planarizing results in LC gate structure 140 (FIG. 5) having a first gate height (GH1) less than a second gate height (GH2) of SC gate structure 150 (FIG. 5). In accordance with embodiments of the disclosure, planarization establishes a final, first gate height (GH1) for LC gate structure 140. As noted, the planarization removes more gate material 134 at a location for LC gate structure 140 (FIG. 5) than at a location for SC gate structure 150 (FIG. 5). More particularly, because LC gate structures 140 have long channel regions 142, they have greater area exposed to the planarization process. As a result, LC gate structures 140 tend to have gate material 134 removed faster than the smaller, more densely patterned SC gate structures 150 for short channel regions 152. This phenomenon may be referred to as "dishing" in the LC gate structure 140 region. First gate spacer 122A is also made shorter than second gate spacer 122B by the planarizing. Conventionally, subsequent processes accept that LC gate structures 140 will be of less gate height than those for SC gate structures 150, and accept any corresponding performance degradation.

Figure 6:
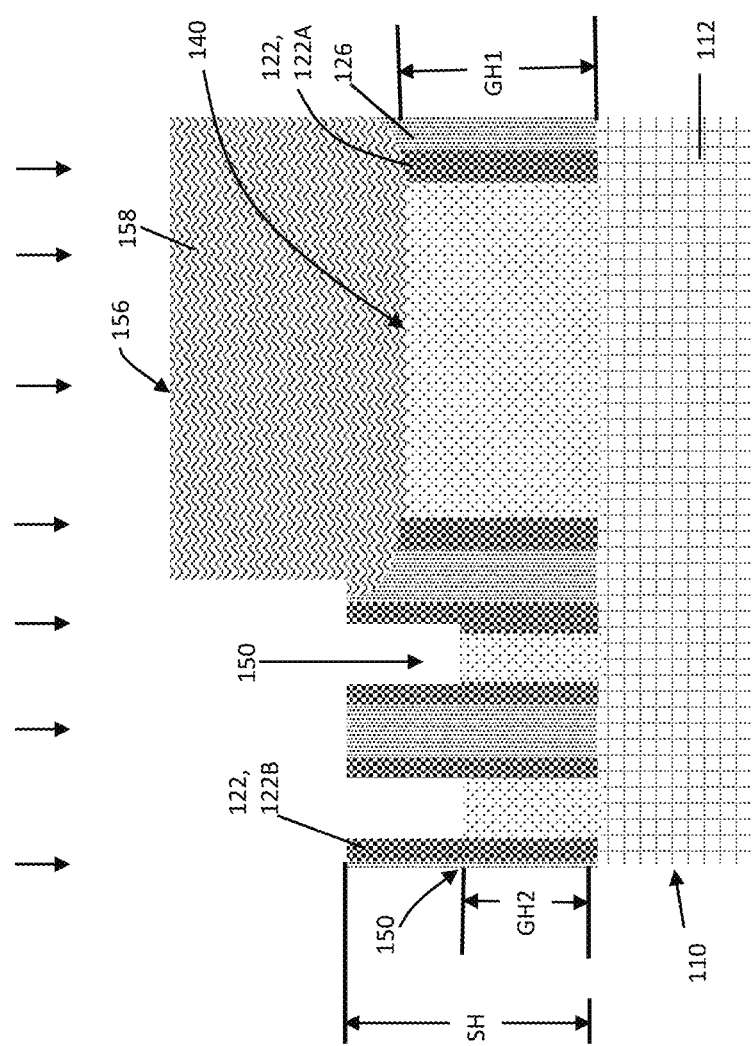
FIG. 6 shows a cross-sectional view of recessing a short channel gate structure according to embodiments of the disclosure.

In contrast to conventional processes, embodiments of the disclosure, as shown in the cross-sectional views of FIGS. 5-6, form a mask 156 (FIG. 6) over LC gate structure 140, exposing SC gate structure 150. Mask 156 may be formed using any now known or later developed masking process. The term "mask" may be given to a layer of material which is applied over an underlying layer of material, and patterned to have openings, so that the underlying layer can be processed where there are openings. After processing the underlying layer, the mask may be removed. Mask 156 may include a developable organic planarization layer (OPL) on the layer to be etched, a developable anti-reflective coating (ARC) layer on the developable OPL (prior two layers not shown individually), and a photoresist mask layer on the developable ARC layer. In another option, as shown in the example of FIG. 5, a hard mask 158 may be formed, and then a photoresist 160 formed thereover. As shown in FIG. 6, photoresist 160 may be patterned and etched, and then used to etch hard mask 158 to expose SC gate structure 150.

As shown in FIG. 6, embodiments of the method may further include recessing gate material 134 to have second gate height GH2 (for SC gate structure 150) be no larger than the first gate height GH1 (for LC gate structure 140). For clarity purposes, second gate height GH2 is illustrated as significantly less than first gate height GH1. Thus, the recessing may also include recessing second gate height GH2 to be less than first gate height GH1. The recessing, e.g., wet etching, is selective to gate material 134. After the recessing, second gate spacer 122B has a spacer height SH greater than second gate height GH2, and also first gate height GH1. While the gate height difference may vary, in one non-limiting example, second gate height GH2 of SC gate structure 150 is at least 5 nanometers less than first gate height GH1 of LC gate structure 140.

Figure 7:
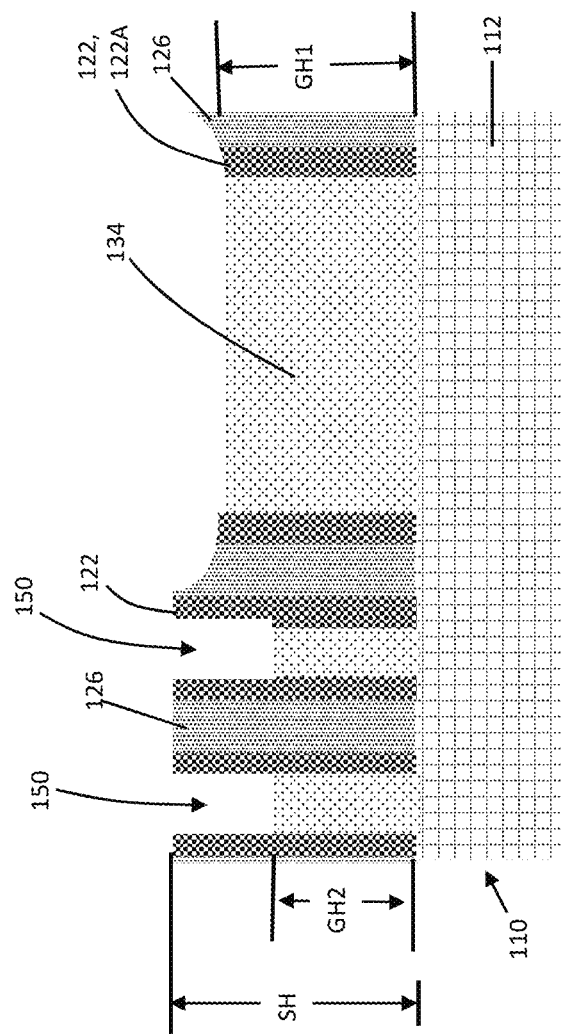
FIG. 7 shows a cross-sectional view of removing a mask according to embodiments of the disclosure.

FIG. 7 shows a cross-sectional view of removing mask 156 (FIG. 6). Mask 156 may be remove using any appropriate removal process for the mask material, e.g., an ashing process.

Figure 8:
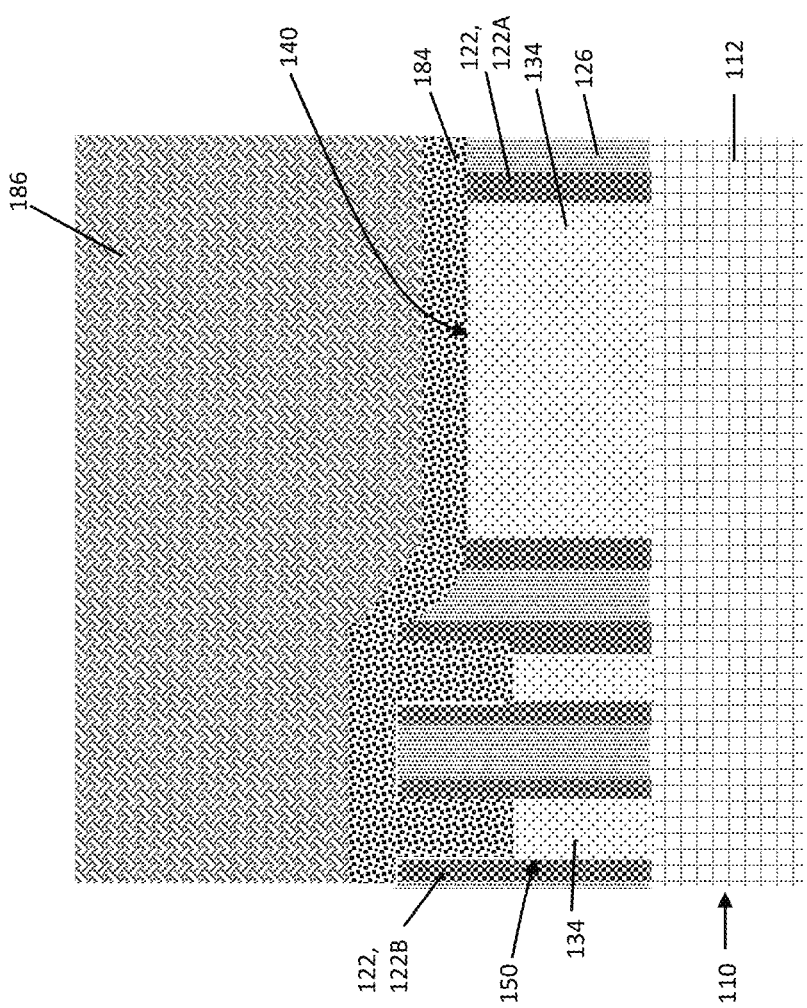
FIG. 8 shows a cross-sectional view of forming a cap layer and a dielectric layer according to embodiments of the disclosure.
Figure 9:
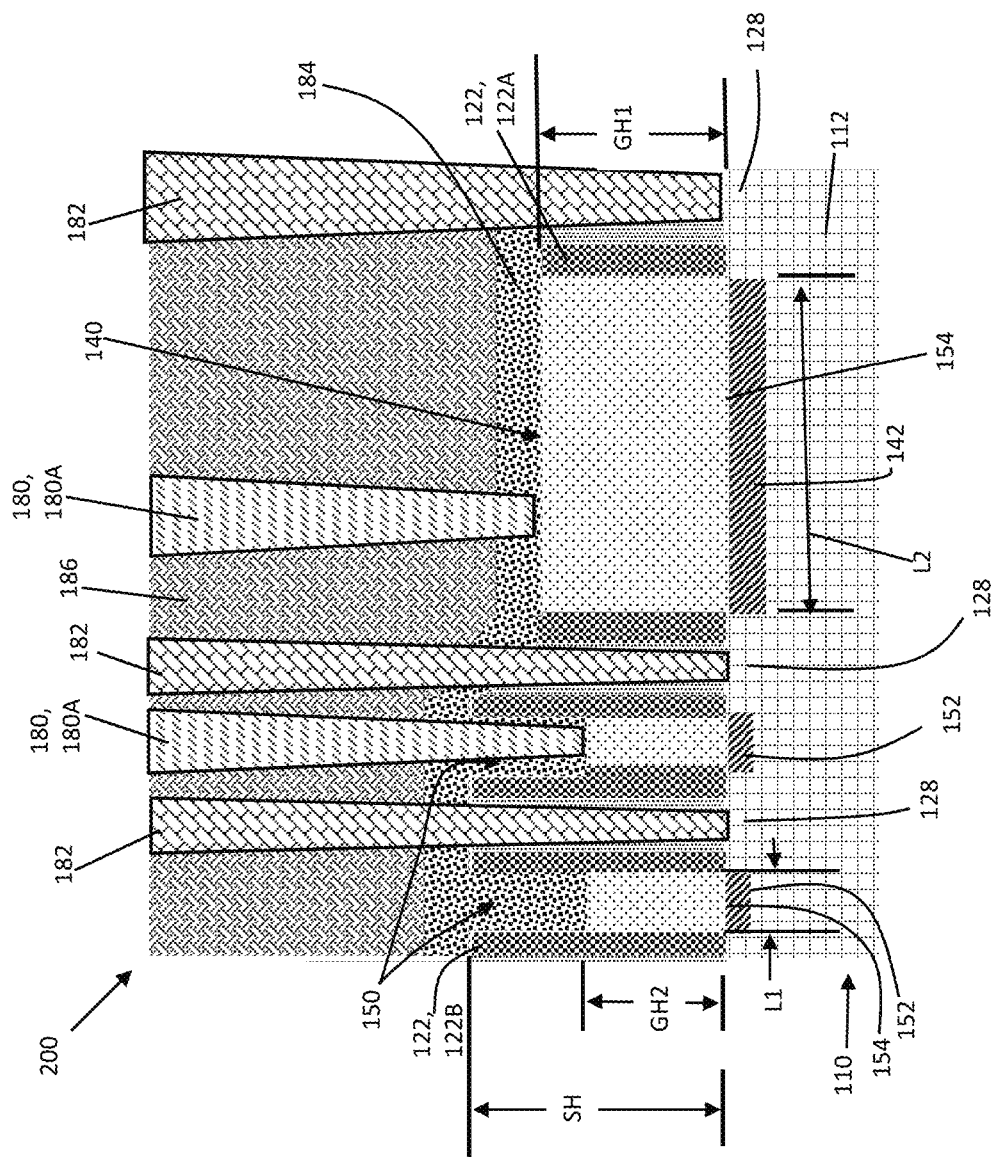
FIG. 9 shows a cross-sectional view of forming contacts, and of an IC structure, according to embodiments of the disclosure.

FIGS. 8 and 9 show forming a contact 180 (FIG. 9) to each of LC gate structure 140 and SC gate structures 150, i.e., one contact to each gate structure. In addition, contacts 182 (FIG. 9) may be formed to source/drain regions 128. It is noted that contact(s) 180 (FIG. 9), while shown in the same plane (e.g., plane of page) as contacts 182 (FIG. 9), may not be in the same plane. This process may include a number of steps, one non-limiting example of which will be described herein. In one embodiment, as shown in FIG. 8, forming contacts 180 may include forming a cap layer 184 over LC gate structure 140 and SC gate structure 150. Cap layer 184 may include any now known or later developed capping material such as but not limited to: silicon nitride and silicon oxide. As shown in FIG. 8, due to the recessing in FIG. 6, cap layer 184 is thicker over SC gate structure 150 than LC gate structure 140. Cap layer 184 substantially fills the empty space in second gate spacer 122B over gate material 134 therein, and covers an upper end of second gate spacer 122B, an upper end of first gate spacer 122A and gate material 134 in first gate spacer 122A. Cap layer 184 may be deposited using any appropriate method for the material used, e.g., ALD. There may optionally be airgaps or voids formed in the space filled between gate spacer 122B.

FIG. 8 also shows forming a dielectric layer 186 over cap layer 184, LC gate structure 140 and SC gate structure 150. As shown in FIG. 8, dielectric layer 186 is thicker over LC gate structure 140 than SC gate structure 150, i.e., due to the differences in height of at least second gate spacer 122B and cap layer 184 thereover. Dielectric layer 186 may include any of the materials listed herein for ILD 126, e.g., a TEOS based silicon dioxide ($SiO_2$). Dielectric layer 186 may be deposited using any appropriate method for the material used, e.g., ALD.

FIG. 9 shows forming a first contact 180A to LC gate structure 140 and a second contact 180B to SC gate structure 150. Contacts 182 may be formed using any now known or later developed contact forming processes. In one non-limiting example, contacts 182 may be formed by patterning a mask (not shown), etching contact openings to the respective gate structures through dielectric layer 186 and cap layer 184, and forming a conductor in the openings. The conductor may include refractory metal liner, and a contact metal. The refractory metal liner (not labeled for clarity) may include, for example, ruthenium (Ru), tantalum (Ta), titanium (Ti), tungsten (W), iridium (Jr), rhodium (Rh) and platinum (Pt), etc., or mixtures of thereof. The contact metal may any now known or later developed contact metal such as but not limited to copper (Cu) or tungsten (W). As illustrated, due to the recessing of FIG. 6, second contact 180B to SC gate structure 150 is longer than first contact 180A to LC gate structure 140. Contacts 182 to source/drain regions 128 may be formed in a similar manner as contacts 180.

FIG. 9 shows a cross-sectional view of an IC structure 200 according to embodiments of the disclosure. IC structure 200 may include LC gate structure 140 over first, long channel region 142. LC gate structure 140 has first gate height GH1. IC structure 200 may also include SC gate structure 150 over second, short channel region 152. SC gate structure 150 has a second gate height GH2. As noted, short channel region 152 is shorter in length than long channel region 142, e.g., length L1<length L2. Bottom surfaces 154 of LC gate structure 140 and SC gate structure 150 are substantially co-planar. In contrast to conventional devices, second gate height GH2 of SC gate structure 150 is no larger than first gate height GH1 of LC gate structure 140. More particularly, second gate height GH2 of SC gate structure 150 may be less than first gate height GH1 of LC gate structure 140. As noted, while the gate height difference may vary, in one non-limiting example, second gate height GH2 of SC gate structure 150 is at least 5 nanometers less than first gate height GH1 of LC gate structure 140. IC structure 200 may also include cap layer 184 over LC gate structure 140 and SC gate structure 150 where cap layer 184 is thicker over SC gate structure 150 than LC gate structure 140, i.e., because of the recessing of FIG. 6. IC structure 200 may also include dielectric layer 186 over cap layer 184, LC gate structure 140 and SC gate structure 150. As noted, dielectric layer 186 is thicker over LC gate structure 140 than SC gate structure 150, i.e., due to the differences in height of at least second gate spacers 122B and cap layer 184 thereover. IC structure 200 may also include first contact 180A (in dielectric layer 186 and cap layer 184) to LC gate structure 140 and second contact 180B to SC gate structure 150. As noted, second contact 180B is longer than first contact 180A. Gate spacer 122B abuts SC gate structure 150, and has a spacer height SH greater than second gate height GH2 of SC gate structure 150. Spacer height SH is also greater than first gate height GH1 of LC gate structure 140.

Embodiments of the disclosure provide an IC structure 200 having LC gate structure and SC gate structure together, but with lesser gate height for the SC gate structure. The lesser gate height allows for improved device performance.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
   a first gate structure over a first channel region, the first gate structure having a first gate height;
   a second gate structure over a second channel region, the second gate structure having a second gate height; and
   a gate spacer abutting the second gate structure, the gate spacer having a spacer height greater than the second gate height,
   wherein the second channel region is shorter in length than the first channel region, and
   wherein the second gate height of the second gate structure is no larger than the first gate height of the first gate structure.

2. The IC structure of claim 1, wherein the second gate height of the second gate structure is less than the first gate height of the first gate structure.

3. The IC structure of claim 2, wherein the second gate height of the second gate structure is at least 5 nanometers less than the first gate height of the first gate structure.

4. The IC structure of claim 1, further comprising a cap layer over the first gate structure and the second gate structure, the cap layer being thicker over the second gate structure than the first gate structure.

5. The IC structure of claim 4, further comprising a dielectric layer over the cap layer, the first gate structure and the second gate structure, wherein the dielectric layer is thicker over the first gate structure than the second gate structure.

6. The IC structure of claim 5, further comprising a first contact in the dielectric layer to the first gate structure and a second contact in the dielectric layer to the second gate structure, wherein the second contact is longer than the first contact.

7. The IC structure of claim 1, wherein a bottom surface of the first gate structure and the second gate structure are substantially co-planar.

8. The IC structure of claim 1, wherein the spacer height is greater than the first gate height.

9. The IC structure of claim 1, further comprising a gate spacer abutting the second gate structure, the gate spacer having a spacer height greater than the first gate height and the second gate height, and
   wherein the second gate height of the second gate structure is less than the first gate height of the first gate structure.

10. An integrated circuit (IC) structure, comprising:
    a long channel (LC) gate structure over a first channel region, the LC gate structure having a first gate height;
    a short channel (SC) gate structure over a second channel region, the SC gate structure having a second gate height; and
    a gate spacer abutting the SC gate structure, the gate spacer having a spacer height greater than the first gate height and the second gate height,
    wherein the second channel region is shorter in length than the first channel region,
    wherein the second gate height of the SC gate structure is no larger than the first gate height of the LC gate structure.

11. The IC structure of claim 10, wherein the second gate height of the SC gate structure is less than the first gate height of the LC gate structure.

12. The IC structure of claim 11, wherein the second gate height of the SC gate structure is at least 5 nanometers less than the first gate height of the LC gate structure.

13. The IC structure of claim 10, further comprising a cap layer over the LC gate structure and the SC gate structure, the cap layer being thicker over the SC gate structure than the LC gate structure.

14. The IC structure of claim 13, further comprising a dielectric layer over the cap layer, the LC gate structure and the SC gate structure, wherein the dielectric layer is thicker over the LC gate structure than the SC gate structure.

15. The IC structure of claim 14, further comprising a first contact in the dielectric layer to the LC gate structure and a second contact in the dielectric layer to the SC gate structure, wherein the second contact is longer than the first contact.

16. The IC structure of claim 10, wherein a bottom surface of the LC gate structure and the SC gate structure are substantially co-planar.

17. The IC structure of claim 10, wherein the spacer height is greater than the first gate height.

18. A method, comprising:
    forming a gate material for a first gate structure over a first channel region and for a second gate structure over a second channel region, wherein the second channel region is shorter in length than the first channel region, wherein the second gate structure includes a gate spacer;

planarizing the gate material, resulting in the first gate structure having a first gate height less than a second gate height of the second gate structure;

forming a mask over the first gate structure, exposing the second gate structure;

recessing the gate material to have the second gate height be no larger than the first gate height, wherein the gate spacer has a spacer height greater than the first gate height and the second gate height;

removing the mask; and forming a contact to each of the first and second gate structures.

* * * * *